Figure 1:
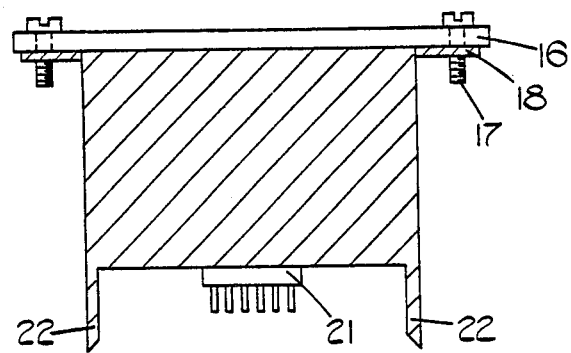
Figure 1:
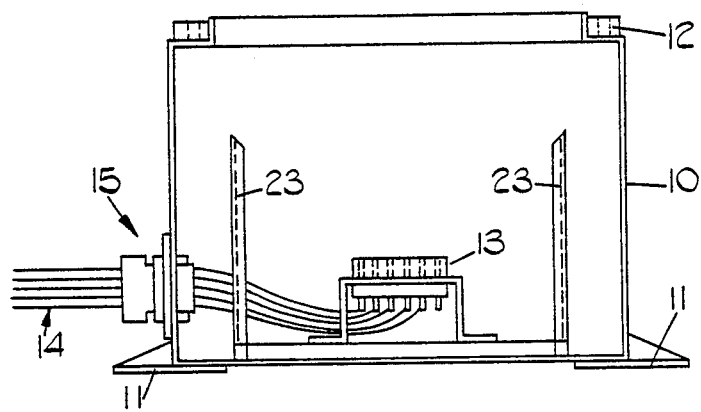

United States Patent [19]

Brown

[11] Patent Number: 4,470,002
[45] Date of Patent: Sep. 4, 1984

[54] MOUNTING ARRANGEMENTS FOR ELECTRICAL POWER CIRCUITS

[75] Inventor: Robert H. Brown, Kingston on Thames, England

[73] Assignee: Lucas Industries plc, Birmingham, England

[21] Appl. No.: 385,320

[22] Filed: Jun. 4, 1982

[30] Foreign Application Priority Data

Jun. 5, 1981 [GB] United Kingdom ............... 8117291

[51] Int. Cl.³ .............................................. H05K 7/20
[52] U.S. Cl. ........................................ 320/1; 361/386
[58] Field of Search ............... 361/380, 382, 383, 386, 361/388, 392, 395, 399; 174/16 HS; 339/112 R, 112 L; 320/1; 363/141

[56] References Cited

U.S. PATENT DOCUMENTS

| 3,462,553 | 8/1969 | Spranger | 361/383 |
| 3,467,891 | 9/1969 | Mogle | 361/385 |
| 3,601,661 | 8/1971 | Kleinhample, Jr. | 361/395 |
| 4,172,272 | 10/1979 | Schneider | 361/386 |
| 4,241,380 | 12/1980 | Lehmann | 361/383 |

FOREIGN PATENT DOCUMENTS 2041577 1/1980 United Kingdom .

Primary Examiner—G. P. Tolin

[57] ABSTRACT

A mounting arrangement for an electrical power circuit includes a casing and a lid which can be secured to the casing to close an open end thereof. The lid carries the heat producing components of a power circuit and acts in use, to dissipate the heat produced by said components.

3 Claims, 2 Drawing Figures

MOUNTING ARRANGEMENTS FOR ELECTRICAL POWER CIRCUITS

This invention relates to a mounting arrangement for an electrical power circuit more particularly to a power circuit for supplying power under the control of a control signal, to a solenoid forming part of the fuel system of an internal combustion engine.

An example of the application of such a power circuit is shown in published British application No. 2041577A. In the arrangement described in this application the power circuit supplies electric current to a solenoid which controls the operation of a valve which when the solenoid is energized, closes to allow fuel to be delivered to the engine during the inward movement of an engine actuated pumping plunger. The valve must of course be operated in timed relationship with the engine and must operate quickly to provide precise control of the quantity of fuel delivered to the engine and also the instant of fuel delivery.

In order to achieve rapid operation of the valve, energy is stored in a capacitor and is discharged into the solenoid using semi-conductor switches. The charging circuits for the capacitor also utilize semi-conductor devices and as a result of the operation of the devices and switches, considerable heat is generated. Moreover, the power supplied to the power circuit at least in the case of a stationary engine or a marine engine will be the mains power supply. In order to protect the components forming the power circuit it is necessary for them to be totally enclosed however, in the event of failure of the power circuit it is essential that it should be capable of being replaced quickly in order that the associated engine can be brought back into operation as quickly as possible. In such a situation it is possible that the person effecting the replacement may forget to take the elementary precaution of turning off the power supply to the power circuit.

It is therefore an object of the invention to provide a mounting arrangement for a power circuit in a simple and convenient form.

According to the invention a mounting arrangement for a power circuit comprises a casing adapted to be mounted upon a fixed support, said casing having an open end, a lid which can close the open end of the casing, means for establishing a seal between the lid and the casing, a support frame secured to the lid, the heat producing components of the power circuit being mounted on or in heat conducting relationship with the lid, a socket mounted in the casing and facing said open end thereof, a plug mounted on said frame for engagement with said socket to effect electrical connection to the power circuit when the lid is secured to the casing and co-operating guide means on the frame and the casing to guide the engagement of the plug and socket.

According to a further feature of the invention the power circuit includes a capacitor and means is provided to discharge the capacitor.

Two examples of mounting arrangements in accordance with the invention will now be described with reference to the accompanying drawings.

Referring to FIG. 1 of the drawings the mounting arrangement includes a casing 10 which is provided with feet 11 whereby it can be permanently secured to a support for example the engine structure. The casing has an open end about which is defined a flange 12. Within the casing there is mounted a socket 13 which faces the open end of the casing and which is connected to supply and control cables 14 which extend through a sealed gland 15 in the side wall of the casing.

Figure 2:
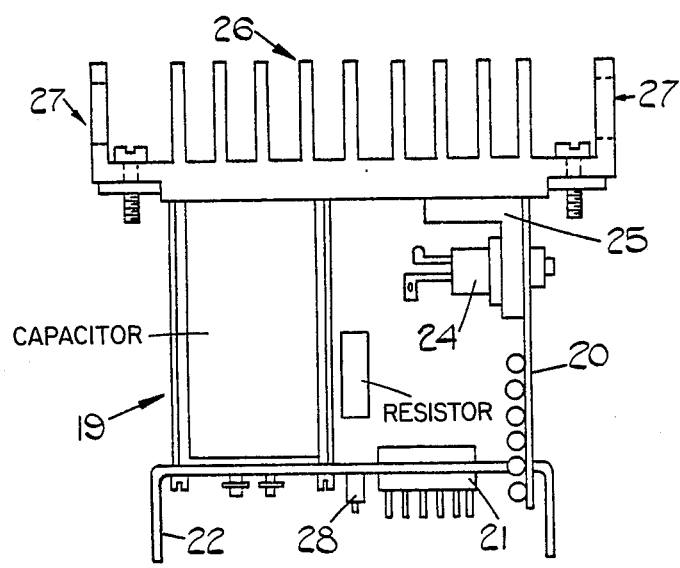

The mounting arrangement also includes a lid 16 which can be secured to the flange 12 by means of captive bolts 17. In addition, the lid carries a seal 18 for engagement with the flange 12 to provide a fluid tight seal between the lid and the casing. As shown in FIG. 2, the lid carries a frame generally indicated at 19, and which provides support for printed circuit boards 20 or other circuit boards. In particular the frame supports a plug 21 for engagement with the socket 13 when the lid is secured to the casing. The frame and the casing carry co-operating guide means 22, 23 which guide the movement of the plug towards the socket so as to ensure correct engagement thereof. Conveniently the guides are of "L" section material.

In the example shown in FIG. 1 the lid 16 is a plain lid having a generally smooth outer surface. The heat producing components of the power circuit are mounted on the lid or as shown in FIG. 2, in heat conducting relationship therewith. In FIG. 2 a component indicated at 24, is mounted on a bracket 25 carried by the lid. In the arrangement shown in FIG. 2 the lid has cooling fins 26 formed integrally therewith. The fins extend from the front face of the lid and act to dissipate heat which is generated by the components 24.

By the arrangement described when the lid is secured to the casing, the components are totally enclosed and the lid acts as a heat sink to dissipate the heat. When it is required to change the power circuit the retaining bolts 17 are removed and the lid can then be withdrawn from the casing. In so doing the plug and the socket separate so that even if the power supply is still connected to the socket, the danger to the operator is minimized.

A discharge means is provided to discharge the capacitors contained in the power circuit to minimize the risk of the operator sustaining an electrical shock. The discharge means can be in the form of a resistor or resistors which is/are connected across the capacitors by means of a suitable switch. The switch may be operated by the operator but as shown in FIGS. 2 at 28, it is preferable that it should be operated automatically as the lid is removed.

In FIG. 2, the lid is conveniently provided with handles 27 to facilitate the operation of replacement of the power circuit.

I claim:

1. A mounting arrangement and a power circuit comprising a casing adapted to be mounted upon a fixed support, said casing defining an enclosure having an open end, a lid which can close the open end of the casing, means for establishing a seal between the lid and the casing, a support frame secured to the lid, cooperating guide means on the frame and casing, the power circuit including heat producing components which are mounted on the lid or are in heat conducting relationship with the lid, a socket mounted on the casing and facing the open end of the casing and a plug carried on the frame for engagement with said socket to effect electrical connection to the power circuit, said plug and socket being guided for engagement by said guide means as the frame is passed into the casing, said power circuit including a capacitor, a switch operable upon initial movement of the lid and frame from the casing, said switch being connected in a discharge circuit for said capacitor whereby the capacitor will be discharged upon operation of said switch.

2. A mounting arrangement according to claim 1 in which said lid is provided with fins to assist the cooling of the lid and the components in heat exchange relationship therewith.

3. A mounting arrangement according to claim 1 in which said discharge circuit includes a resistor connected in series with said switch.

* * * * *